United States Patent [19]

Nagano

[11] 4,223,276
[45] Sep. 16, 1980

[54] VOLTAGE FOLLOWER CIRCUIT

[75] Inventor: Katsumi Nagano, Yokohama, Japan

[73] Assignee: Tokyo Shibaura Denki Kabushiki Kaisha, Japan

[21] Appl. No.: 13,971

[22] Filed: Feb. 22, 1979

[30] Foreign Application Priority Data

Feb. 23, 1978 [JP] Japan .................................. 53-20276

[51] Int. Cl.² .......................... H03F 3/45; H03F 3/04
[52] U.S. Cl. .................................. 330/257; 330/259; 330/260
[58] Field of Search ............... 330/252, 257, 259, 260; 307/299 B

[56] References Cited

U.S. PATENT DOCUMENTS 4,147,944  4/1979  Monticelli ........................ 330/257 X

OTHER PUBLICATIONS

R. W. Russell et al., "Automotive and Industrial Electronic Building Blocks", *IEEE Journal of Solid-State Circuits*, vol. SC-7, No. 6, Dec. 1972, pp. 446-454.
Solomon, "The Monolithic Op Amp: A Tutorial Study", *IEEE Journal of Solid-State Circuits*, vol. SC-9, No. 6, Dec. 1974, pp. 314-332.

*Primary Examiner*—James B. Mullins
*Attorney, Agent, or Firm*—Finnegan, Henderson, Farabow, Garrett & Dunner

[57] ABSTRACT

A voltage follower circuit which has first and second transistors each having two collectors. The second collector of each transistor has a smaller area than the first collector thereof. Third and fourth transistors connected as a current source have their collectors connected to the first collectors of the first and second transistors, respectively, and connected also to the second collectors of the second and first transistors, respectively. A fifth transistor has its base and emitter respectively connected to the first collector and base of the second transistor. An input signal is supplied to the base of the first transistor and an output signal is taken from the emitter of the fifth transistor.

6 Claims, 8 Drawing Figures

FIG. 3
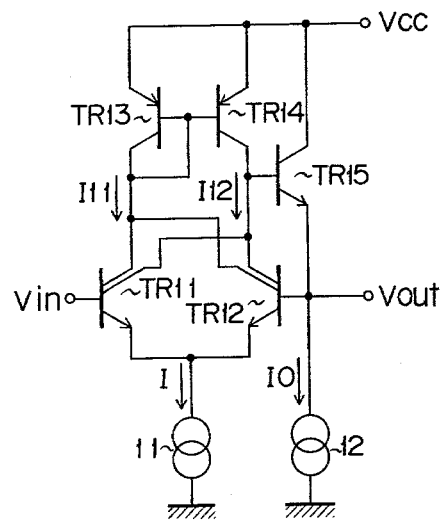
FIG. 4
PRIOR ART
FIG. 5
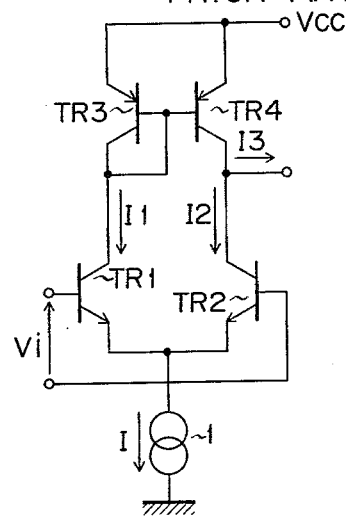

VOLTAGE FOLLOWER CIRCUIT

BACKGROUND OF THE INVENTION

This invention relates to a voltage follower circuit.

FIG. 1 shows the schematic arrangement of a prior art voltage follower circuit. This voltage follower circuit includes npn transistors TR1, TR2 whose emitters are grounded through a constant current source 1, a pnp transistor TR3 whose collector and base are connected to the collector of the npn transistor TR1 and whose emitter is connected to a power supply terminal $V_{CC}$, a pnp transistor TR4 whose base is connected to the base of the pnp transistor TR3, whose collector is connected to the collector of the npn transistor TR2, and whose emitter is connected to the power supply terminal $V_{CC}$, and an npn transistor TR5 whose base is connected to the collector of the npn transistor TR2, whose collector is connected to the power supply terminal $V_{CC}$ and whose emitter is connected to the base of the npn transistor TR2 and also grounded through a constant current source 2. The base of the transistor TR1 is connected to an input terminal $V_{in}$. The base of the transistor TR2 is connected to an output terminal $V_{out}$.

Where, with the above-mentioned prior art voltage follower circuit, an output voltage, that is, the base voltage of the transistor TR2 runs higher than an input voltage, that is, the base voltage of the transistor TR1, then a large current runs through the collector TR2. As a result, the base potential and consequently emitter potential of the transistor TR5 falls, causing the base potential of the transistor TR2 to drop and also an output voltage from the transistor TR2 to approach an input voltage.

Conversely where an output voltage becomes lower than an input voltage, then the collector current of the transistor TR2 drops to raise the base potential of the transistor TR5, leading to a rise in the emitter potential of the transistor TR5 and also in an output voltage.

The prior art voltage follower circuit of FIG. 1 has a simple arrangement and has the advantage that a difference between the input and output voltages, that is, offset voltage is low. However, this prior art voltage follower circuit has the drawback that since the transistors TR1, TR2 are designed to have a large gain in order to reduce the offset voltage, an oscillation tends to occur in this circuit. To suppress the oscillation, therefore, a resistor 3 is connected, as shown in FIG. 1, between the base of the transistor TR2 and the emitter of the transistor TR5, and a capacitor 4 is provided between the base and collector of the transistor TR2. However, formation of the capacitor 4 unavoidably enlarges the area of a required chip, giving rise to difficulties in integrating such voltage follower circuit.

SUMMARY OF THE INVENTION

It is accordingly the object of this invention to provide a voltage follower circuit which is saved from the phenomenon of oscillation and adapted for integration.

According to an aspect of the invention, there is provided a voltage follower circuit which comprises a current source including first and second transistors; a third transistor whose first collector is connected to the collector of the first transistor, whose second collector has a smaller area than its own first collector and whose base is supplied with an input signal; a fourth transistor whose first collector is connected to the collector of the second transistor and also to the second collector of the third transistor and, whose second collector has a smaller area than its own first collector and is connected to the first collector of the third transistor; and a fifth transistor whose base and emitter are respectively connected to the first collector and the base of the fourth transistor.

BRIEF DESCRIPTION OF THE DRAWING

FIG. 3 sets forth the arrangement of a voltage follower circuit embodying this invention;

FIG. 4 shows the arrangement of a differential amplifier circuit corresponding to the prior art voltage follower circuit of FIG. 1;

FIG. 5 indicates the arrangement of a differential amplifier circuit corresponding to the voltage follower circuit of FIG. 3 embodying the invention;

DETAILED DESCRIPTION OF THE INVENTION

There will now be described by reference to the accompanying drawing a voltage follower circuit according to one embodiment of this invention. Referring to FIG. 3, the subject voltage follower circuit includes multicollector type npn transistor TR11, TR12 whose emitters are both grounded through a common constant current element 11 and a pair of pnp transistors TR13, TR14 jointly constituting a current source. The transistors TR13 and TR14 may be formed of, for example, lateral transistors. The first collector of the transistor TR11 is connected to the collector and base of the transistor TR13 and the base of the transistor TR14. The second collector of the transistor TR11 is connected to the collector of the transistor TR14 and the first collector of the transistor TR12. The second collector of the transistor TR12 is connected to the first collector of the transistor TR11. The first collector of the transistor TR12 is further connected to the base of an npn transistor TR15, whose collector is connected to a power supply terminal $V_{CC}$, together with the emitters of the transistors TR13, TR14, and whose emitter is connected to the base of the transistor TR12, and grounded through a constant current source element 12 such as a resistor. The input terminal $V_{in}$ of the present voltage follower circuit is connected to the base of the transistor TR11. The output terminal $V_{out}$ thereof is connected to the base of the transistor TR12. The present voltage follower circuit of FIG. 3 is operated in fundamentally the same manner as the prior art voltage follower circuit of FIG. 1.

There will now be described by reference to the differential amplifier circuits of FIGS. 4 and 5 the operation characteristics of the voltage follower circuit of FIG. 3 according to one embodiment of this invention.

Figure 1:
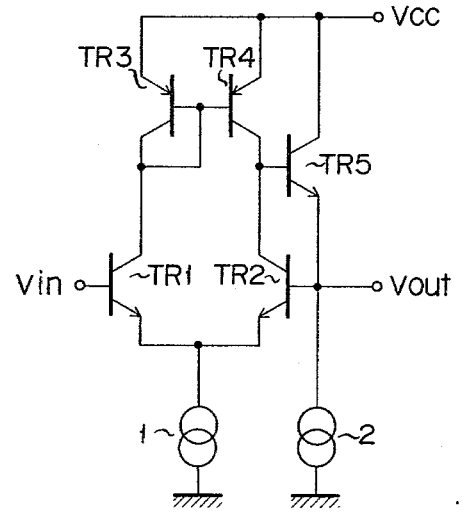
FIG. 1 shows the arrangement of the prior art voltage follower circuit.
Figure 2:
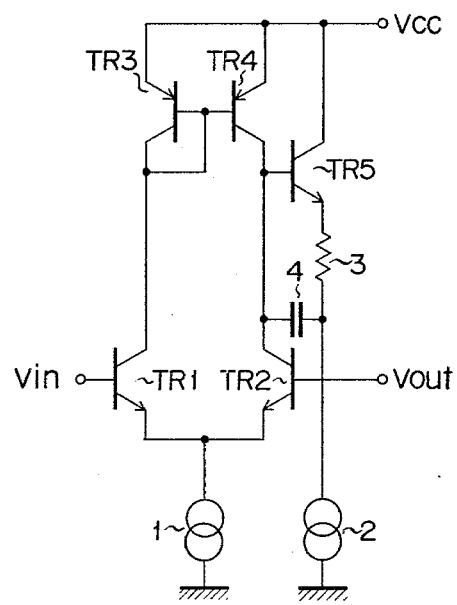
FIG. 2 indicates the prior art voltage follower circuit so devised as to suppress the occurrence of objectionable oscillation therein.

FIG. 4 shows the arrangement of a differential amplifier circuit corresponding to the prior art voltage follower circuit of FIG. 1. With the differential amplifier circuit of FIG. 4, an input signal is supplied between the bases of the transistors TR1, TR2, and an output signal is drawn off from the collector of the transistor TR4.

Where the prior art differential amplifier circuit of FIG. 4 is supplied with an input voltage $V_i$, then the transistors TR1, TR2 are impressed with collector currents I1, I2 respectively expressed by the following equations:

$$I1 = (e^{Vi/VT}/1 + e^{Vi/VT}) I \qquad (1)$$

$$I2 = (1/1 + e^{Vi/VT}) I \qquad (2)$$

where:
VT = thermal voltage occurring in the base-emitter junctions of the transistors TR1, TR2
I = current running through a constant current element 1.

Assuming that the emitter-grounded transistors TR1 to TR4 have an infinite current amplification factor $\beta$, a current I3 drawn off from the junction of the collectors of the transistors TR2, TR4 is expressed by the following equation:

$$I3 = I1 - I2 = (1 - e^{Vi/VT}/1 + e^{Vi/VT}) I \qquad (3)$$

Where an input voltage is sufficiently lower than the thermal voltage VT, then there results the following equation:

$$e^{Vi/VT} \simeq 1 + Vi/VT$$

Therefore, the above equation (3) may be rewritten as follows:

$$I3 \simeq (Vi/VT/2 + (Vi/VT)) I \qquad (4)$$

When supplied with an input signal of low voltage, the prior art differential amplifier circuit of FIG. 4 has a transconductance gm expressed by the following equation:

$$gm = I3/Vi \simeq (I/2) VT = qI/2KT \qquad (5)$$

where:
q = amount of electron charge
T = absolute temperature
K = Boltzmann's constant FIG. 5 shows the arrangement of a differential amplifier circuit corresponding to the voltage follower circuit of FIG. 3 embodying this invention. Where an input voltage Vi is impressed between the bases of the transistors TR11, TR12, then current I11 flowing through the collector of the transistor TR11 and the current I12 running through the collector of the transistor TR12 are respectively expressed by the following equations:

$$I11 = (n/1 + n)I1 + (1/1 + n)I2 \qquad (6)$$

$$I12 = (n/1 + n)I2 + (1/1 + n)I1 \qquad (7)$$

where:
n is the ratio of area of the first and second collectors of the transistor TR11 and TR12 and I1, I2 are collector currents of the transistors TR1, TR2 of FIG. 4 respectively.

An output current I13 drawn off from the junction of the first collector terminal of the transistor TR12 and the collector terminal of the transistor TR14 is expressed by the following equation:

$$I13 = I11 - I12 = \frac{n-1}{n+1}(I1 - I2) \qquad (8)$$

$$= \frac{n-1}{n+1}\left(-\frac{1 - e^{Vi/VT}}{1 + e^{Vi/VT}}\right)$$

Where an input voltage Vi is sufficiently lower than an thermal voltage VT, then the transconductance gm 1 of the differential amplifier circuit of FIG. 5 embodying this invention is expressed by the following equation:

$$gm\,1 = (n - 1/n + 1)(qI/2KT) \qquad (9)$$

Comparison between the equations (9) and (5) shows that the differential amplifier circuit of FIG. 5 embodying this invention has a transconductance $(n - 1/n + 1)$ times lower than the prior art differential amplifier circuit of FIG. 4. Where n is chosen to be a number ranging, for example, from 1.22 to 3, then the gains of the transistors TR11, TR12 are reduced, making it possible to effectively suppress the occurrence of oscillation in the voltage follower circuit of FIG. 3 embodying this invention without the necessity of applying a resistor and capacitor for prevention of the oscillation.

There will now be described an offset voltage occurring in the voltage follower circuit of FIG. 3 embodying this invention. The offset voltage is changed chiefly by the ratio between the current-transmitting rates of the transistors TR13, TR14 jointly constituting a current source, and also by the base current of the transistor TR15. Where, in case of no output current from an output terminal, the collector currents of the transistors TR11, TR12 are respectively denoted by I11, I12, the current-amplifying factors of the transistors TR13, TR14 are represented by $\beta_e$, and the current-amplifying factors of the transistors TR11, TR12 are indicated as $\beta_n$, then there results the following equation:

$$(\beta_e/\beta_e + 2) I11 - I12 - IO/\beta_n = 0 \qquad (10)$$

where IO denotes current flowing through a constant current element. The above equation (10) may be rewritten as follows by substituting the equation (6), (7) therein:

$$(\beta_e/\beta_e + 2) \{(n/1 + n)I1 + (1/1 + n)I2\} - \qquad (11)$$
$$\{(n/1 + n)I2 + (1/1 + n)I1 - IO/\beta_n$$
$$= (1/1 + n) \{(\beta_e/\beta_e + 2)n - 1\} I1 + (1/1 + n)$$
$$\{(\beta_e/\beta_e + 2) - n\} I2 - IO/\beta_n = 0$$

The above equation (11) may be rewritten is follows by substituting the equations (1), (2) therein:

$$(1/1 + n) \{(\beta_e/\beta_e + 2)n - 1\}\{e^{Vi/VT}/(1 + e^{Vi/VT})\}I + \qquad (12)$$
$$(1/1 + n) \{(\beta_e/\beta_e + 2) - n\}\{1/(1 + e^{Vi/VT})\}I - IO/\beta_n = 0$$

Assuming I = IO, the above equation (12) may be rewritten as follows:

$$\{(\beta_e/\beta_e + 2)n - 1\} e^{Vi/VT} + \{(\beta_e/\beta_e + 2) - n\} - 1/\beta_n \cdot \qquad (13)$$
$$(1 + n)(1 + e^{Vi/VT}) =$$
$$\{(\beta_e/\beta_e + 2)n - 1 - (1 + n)/\beta_n\} e^{Vi/VT} +$$
$$(\beta_e/\beta_e + 2)n - 1 - (1 + n)/\beta_n = 0$$

Therefore, the offset voltage $V_{os}$ may be expressed as follows:

$$V_{os} = VTl_n \left\{ \frac{(-\beta_e/\beta_e + 2) + n + (1+n)/\beta_n}{(\beta_e/\beta_e + 2)n - 1 - (1+n)/\beta_n} \right\} \quad (14)$$

Assuming $\beta_3 = 10$ and $\beta_n = 100$, the above equation (14) may be rewritten as follows:

$$V_{os} = VTl_n (1.01n - 0.823/0.823n - 1.01) \quad (15)$$

Where the ratio n between the areas of the first and second collectors of each of the transistors TR11, TR12 is changed, then the offset voltage $V_{os}$ varies as shown in the following Table.

| n | $V_{os}$ (mV) |
|---|---|
| 2 | 16.4 |
| 3 | 10.8 |
| 4 | 8.93 |
| 5 | 8.02 |
| 10 | 6.52 |

As seen from the above table, the offset voltage $V_{os}$ is progressively decreased, according as the ratio n between the areas of the first and second collectors of each of the transistors TR11, TR12 is enlarged.

Figure 6:
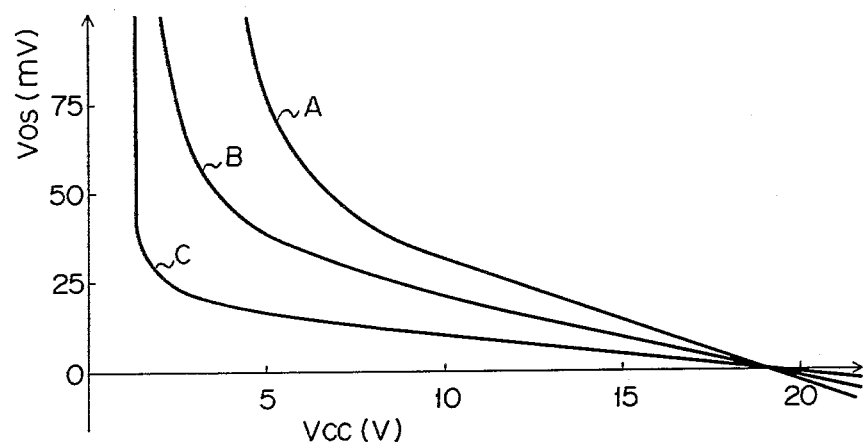
FIG. 6 illustrates the relationship between an offset voltage and a power source voltage.

FIG. 6 shows the relationship between the source voltage $V_{CC}$ and offset voltage $V_{os}$ of the voltage follower circuit of FIG. 3 embodying this invention, with the ratio n between the areas of the collectors of the transistor taken as a parameter. The curves A, B, C of FIG. 6 respectively show the offset voltages obtained when the above-mentioned ratio n was taken to be 2, 3 and infinite. FIG. 6 shows that the offset voltage $V_{os}$ is progressively reduced, according an n grows larger. The offset voltage $V_{os}$ varies with the source voltage $V_{CC}$. The ratio between the levels of the offset voltage obtained when the ratio n was taken to be 2, 3 and 10 (equivalently infinite) coincides with the ratio between the levels of the offset voltage realized when the character n given in the aforesaid equation (15) is taken to be 2, 3 and 10.

Figure 7:
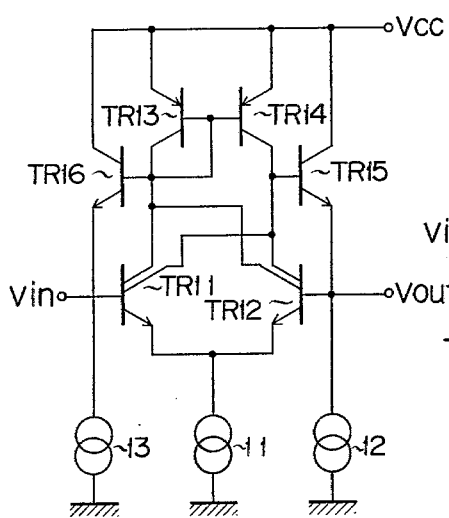
FIGS. 7 and 8 show the arrangements of voltage follower circuits according to other embodiments of the invention.

FIG. 7 shows the arrangement of a voltage follower circuit according to another embodiment of this invention, in which the offset voltage is further reduced by providing the voltage follower circuit of FIG. 3 with a transistor TR16 whose base is connected to the first collector of the transistor 11, and whose emitter is grounded through constant current source element 13 having the same property as the constant current source element 12.

Figure 8:
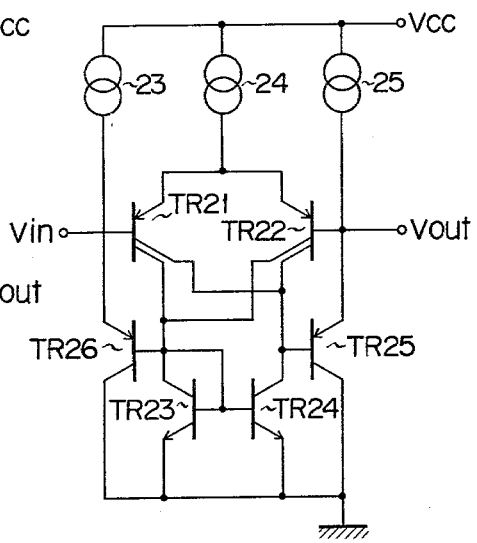

FIG. 8 indicates the arrangement of a voltage follower circuit according to a further embodiment of this invention, in which the transistors TR11, TR12, TR13, TR14, TR15, TR16 constituting the voltage follower circuit of FIG. 7 are replaced by transistors TR21, TR22, TR23, TR24, TR25, TR26 having the opposite conductivity types to those of FIG. 7 and which is provided with constant current source elements 21, 22, 23 corresponding to the constant current source elements of FIG. 7.

This invention has been described by reference to the foregoing embodiments. But the invention is not limited thereto. With the aforesaid embodiments, a pair of transistors TR11, TR12 or a pair of transistors TR21, TR22 jointly constituting a differential amplifier respectively including first and second collectors, the first collector being chosen to have an area n times larger than the second collector. However, it is possible to use a (n+1) number of transistors whose bases are jointly connected, and also whose emitters are jointly connected, apply the collectors of an n number of transistors included in the group collectively as a first collector, and using the collector of the remaining one transistor as a second collector.

What is claimed is:

1. A voltage follower circuit which comprises a current source including first and second transistors of one conductivity type; a third transistor which has the opposite conductivity type to said first and second transistors and whose first collector is connected to the collector of the first transistor, whose second collector has a smaller area than said first collector, and whose base is supplied with an input signal; a fourth transistor which has the opposite conductivity type and whose first collector is connected to the collector of the second transistor and also to the second collector of the third transistor, whose second collector has a smaller area than said first collector and is connected to the first collector of the third transistor and whose emitter is connected to the emitter of the third transistor and also to a first power supply terminal through a first constant current source element; and a fifth transistor which has the opposite conductivity type and whose base and emitter are respectively connected to the first collector and the base of the fourth transistor, and whose collector is connected to a second power supply terminal.

2. The voltage follower circuit according to claim 1, wherein the emitter of the fifth transistor is connected to the first power supply terminal through a second constant current source element.

3. The voltage follower circuit according to claim 2, which further comprises a sixth transistor which has the opposite conductivity type and whose base is connected to the first collector of the third transistor, whose collector is connected to the second power supply terminal, and whose emitter is connected to the first power supply terminal through a third constant current source element having the same property as the second constant current source element.

4. The voltage follower circuit according to claim 1, which further comprises a sixth transistor which has the opposite conductivity type and whose base is connected to the first collector of the third transistor, whose collector is connected to the second power supply terminal and whose emitter is connected to the first power supply terminal through a second constant current source element.

5. The voltage follower circuit according to claim 1, 2, 3 or 4, wherein the third and fourth transistors are of the npn type.

6. The voltage follower circuit according to claim 1, 2, 3 or 4, wherein the third and fourth transistors are of the pnp type.

* * * * *